United States Patent [19]

Ichimura et al.

[11] Patent Number: 4,777,114

[45] Date of Patent: Oct. 11, 1988

[54] PHOTOSENSITIVE RESIN COMPOSITION

[75] Inventors: Kunihiro Ichimura, Ibaraki; Masataka Ito, Tokyo; Masahiro Yamana, Tokyo; Hiroshi Ito, Tokyo, all of Japan

[73] Assignees: Agency of Industrial Science and Technology; Oji Paper Company, Ltd., both of Tokyo, Japan

[21] Appl. No.: 98,693

[22] Filed: Sep. 18, 1987

Related U.S. Application Data

[63] Continuation of Ser. No. 844,445, Mar. 26, 1986, abandoned.

[30] Foreign Application Priority Data

Apr. 3, 1985 [JP]   Japan .................................. 60-69139

[51] Int. Cl.$^4$ ................................................ G03C 1/68
[52] U.S. Cl. ...................................... 430/270; 430/28; 430/287; 525/61; 525/375
[58] Field of Search ........................ 430/270, 287, 28; 525/61, 375

[56] References Cited

U.S. PATENT DOCUMENTS 4,339,524  7/1982  Ichimura et al. ................... 430/270
4,564,580  1/1986  Ichimura et al. ................... 430/270

FOREIGN PATENT DOCUMENTS 2076826  4/1984  United Kingdom .

*Primary Examiner*—Jack P. Brammer
*Attorney, Agent, or Firm*—Armstrong, Nikaido, Marmelstein & Kubovcik

[57] ABSTRACT

A photosensitive resin emulsion composition comprising an aqueous emulsion of a film-forming resin and a protective colloid for said emulsion, wherein the protective colloid comprises at least one photosensitive saponified polyvinyl acetate derivative which is at least partially grafted onto the film-forming resin, and the photosensitive saponified polyvinyl acetate derivative comprises a backbone formed of saponified polyvinyl acetate and at least one photosensitive unit and at least one hydrophobic unit bonded to the backbone.

6 Claims, No Drawings

PHOTOSENSITIVE RESIN COMPOSITION

This application is a continuation of application Ser. No. 844,445 filed Mar. 26, 1986, now abandoned.

BACKGROUND OF THE INVENTION

1. Field of the Invention

The present invention relates to a photosensitive resin composition. More particularly, the present invention relates to a photosensitive resin composition having an excellent photosensitivity, water resistance, water developing property, smoothness, resolving power, and solvent resistance, and valuable for the production of screen printing plates, second originals, and television fluorescent screens

2. Description of the Related Art

A photosensitive composition comprising saponified polyvinyl acetate and a styrylpyridinium salt compound or styrylquinolinium salt compound is known. The photoreaction is photocrosslinking by photodimerization of the styrylpyridinium salt compound or styrylquinolinium salt compound grafted to the saponified polyvinyl acetate. Accordingly, the amount of the hydroxyl group contained in the saponified polyvinyl acetate in the photosensitive layer is not changed by irradiation. Therefore, the water resistance of the portion cured by irradiation is not improved, and the cured portion is extremely swollen during the water development and a high resolving power cannot be obtained.

The following two methods have been tried for eliminating this defect (A) Method using a protecting colloid formed of saponified polyvinyl acetate or a derivative thereof When a photosensitive resin composition comprising a reaction product of saponified polyvinyl acetate with a styrylpyridinium salt compound or styrylquinolinium salt compound is used for formation of an image, in order to enhance the water resistance of an image formed through the light exposure and water development steps, a method is used in which an aqueous emulsion of a polyvinyl acetate resin comprising saponfied polyvinyl acetate as the protective colloid is added to the photosensitive resin composition. In this method, in order to further enhance the water resistance of the image, the content of the protective colloid of the saponified polyvinyl acetate must be controlled to a low level such as 2 to 10% based on the weight of the resin solids of the emulsion.

An improvement of this method using the protective colloid is proposed in Japanese Unexamined Patent Publication (Kokai) No. 59-102232. According to this improved method, a photosensitive unit having a photocrosslinking property is bonded to the main chain of saponified polyvinyl acetate used as the protective colloid so as to further improve the water resistance of the formed image. In this method, it is preferred that the amount of the photosensitive saponified polyvinyl acetate derivative used as the protective colloid be controlled to less than 10%. It is admitted that if this amount exceeds 10%, a desired water resistance cannot be maintained. Furthermore, in the case of a polyvinyl acetate resin-containing emulsion comprising less than 10% of the above-mentioned photosensitive saponified polyvinyl acetate as the protective colloid, the contribution to improvement of the water resistance is not substantially different from the contribution attained when an emulsion comprises an unmodified saponified polyvinyl acetate derivative as the protective colloid. When a polyvinyl acetate resin-containing emulsion comprising less than 10% of the above-mentioned photosensitive saponified polyvinyl acetate derivative as the protective colloid is used, the water resistance of the obtained image is considerably good, but there still remains another problem in that the solvent resistance of the image is very poor. This degradation of the solvent resistance may be prevented by increasing the amount of the reaction product of saponified polyvinyl acetate with the styrylpyridinium salt compound or styrylquinolinium salt compound relative to the polyvinyl acetate resin-containing emulsion, but in this case, reduction of the water resistance of the formed image is caused. Namely, in the method in which the above-mentioned photosensitive saponified polyvinyl acetate is used as the protective colloid for a hydrophobic resin emulsion, it is impossible to simultaneously impart satisfactory improvements of the water resistance and solvent resistance to the formed image.

(B) Method in which saponified polyvinyl acetate or a derivative thereof is rendered hydrophobic Use of a photosensitive resin formed by partially acetalizing the —OH group of saponified polyvinyl acetate by an aldehyde compound to render the saponified polyvinyl acetate hydrophobic and bonding the above-mentioned photosensitive unit to the hydrophobic saponified polyvinyl acetate is effective for improving the water resistance of the formed image. However, if the hydrophobic degree is increased, gelation is often caused in the aqueous emulsion containing the obtained photosensitive resin during the storage. In order to prevent occurrence of this gelation, it is necessary to use a mixture of an organic solvent such as an alcohol and water as the medium of the emulsion, instead of water alone.

Under this background, it is eagerly desired in the art to develop a photosensitive resin containing water alone as the medium, which is capable of forming an image having an excellent water resistance and solvent resistance and having a high resolving power.

SUMMARY OF THE INVENTION

It is a primary object of the present invention to provide a photosensitive resin composition which can be stored for a long time and can be developed by water, which has an appropriate hydrophobic property and has an excellent resolving power, water resistance, solvent resistance, smoothness, and sharpness of the border of a formed image, and which can be formed by using water alone as the medium.

Especially, the present invention provides a photosensitive composition which can be stored stably for a long time and can form an image having an excellent water resistance and solvent resistance by the water development.

In accordance with the present invention, there is provided a photosensitive emulsion composition comprising an aqueous emulsion of a film-forming resin and a protective colloid for the emulsion, wherein the protective colloid comprises at least one photosensitive saponified polyvinyl acetate derivative, the photosensitive saponified polyvinyl acetate derivative comprises a backbone formed of saponified polyvinyl acetate and at least one photosensitive unit and at least one hydrophobic unit bonded to the backbone, the photosensitive unit is selected from groups represented by the following general formula (I):

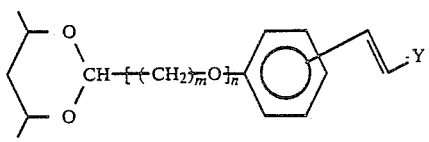 (I)

wherein

stands for a vinyl alcohol unit residue of the saponified polyvinyl acetate in the backbone, Y stands for a group represented by the following formula (II) or (III):

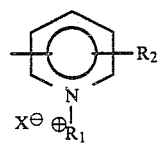 (II)

or

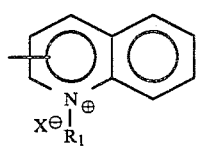 (III)

m is an integer of from 1 to 6, n is 0 or 1, and in the formulae (II) and (III), $R_1$ stands for a hydrogen atom, an unsubstituted alkyl group, an unsubstituted aralykyl group or an alkyl or aralykyl group having at least one member selected from a hydroxyl group, a carbamyl group, an ether bond and an unsaturated bond, $R_2$ stands for a member selected from a hydrogen atom and lower alkyl groups and $X^\ominus$ stands for an anion, and the hydrophobic unit is selected from groups represented by the following formulae (IV), (V) and (VI):

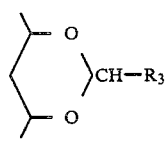 (IV)

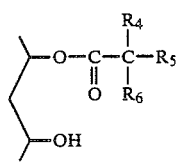 (V)

and

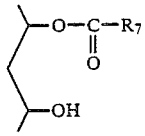 (VI)

wherein

is as defined above, $R_3$ stands for a member selected from a hydrogen atom, an alkyl group having 1 to 18 carbon atoms, a phenyl group, a naphthyl group, an anthryl group, an aminophenyl group, a nitrophenyl group, a halogenophenyl group, styryl group, a benzyl group, an allyl group, a xylyl group, a tolyl group, a carboxyphenyl group and a sulfoxyphenyl group, $R_4$, $R_5$ and $R_6$ independently stand for an alkyl group having 1 to 9 carbon atoms and any one of $R_4$, $R_5$ and $R_6$ may be a hydrogen atom, and $R_7$ stands for a member selected from an alkyl group having 2 to 9 carbon atoms, a phenyl group, a benzyl group, a halogenophenyl group, an allyl group, a naphthyl group, a styryl group, a xylyl group, an anthryl group, a tolyl group, a benzyl group and a propionyl group.

DESCRIPTION OF THE PREFERRED EMBODIMENTS

In the photosensitive resin composition of the present invention, it is preferred that the solid weight ratio of the protective colloid composed of the above-mentioned photosensitive saponified polyvinyl acetate derivative to the above-mentioned film forming resin be within a range of from 5/95 to 99/1, especially from 15/85 to 95/5.

In the composition of the present invention, the protective colloid for the resin emulsion is composed of a photosensitive saponified polyvinyl acetate derivative in which at least one photosensitive unit and at least one hydrophobic unit are bonded to the main chain formed of saponified polyvinyl acetate.

The photosensitive unit is bonded to the vinyl alcohol unit of the main chain of saponified polyvinyl acetate and is represented by the general formula (I).

In the general formula (I), the group of the general formula (II) or (III) as Y is a pyridinium salt residue or quinolinium salt residue, which is generally included in a quaternary ammonium salt residue.

In the general formulae (II) and (III), $R_1$ stands for a hydrogen atom, an unsubstituted alkyl group having preferably 1 to 6 carbon atoms, especially preferably 1 to 4 carbon atoms, such as a methyl, ethyl, propyl, butyl, pentyl or hexyl group, an unsubstituted aralkyl group such as a benzyl, phenylethyl, methylbenzyl or naphthylmethyl group, or an alkyl or aralkyl group having at least one member selected from a hydroxyl group, a carbamyl group, an ether bond and an unsaturated bond (for example, a double bond). Furthermore, in the general formulae (ii) and (III), $R_2$ stands for a hydrogen atom or a lower alkyl group having preferably 1 to 6 carbon atoms, especially preferably 1 to 4 carbon atoms, such as a methyl, ethyl, propyl, butyl, pentyl or hexyl group, and $X^-$ stands for an anion such as a chloride ion, a bromide ion, a sulfate ion, a phosphate ion, a perchlorate ion, a methoxysulfate ion, a p-toluene-sulfonate ion or a hydroborofluorate ion.

The hydrophobic unit bonded to the vinyl alcohol unit of the main chain of saponified polyvinyl acetate is represented by the general formula (IV), (V) or (VI).

In the general formula (IV), $R_3$ is selected from a hydrogen atom, an alkyl group having 1 to 18 carbon atoms, a phenyl group, a naphthyl group, an anthryl group, an aminophenyl group, a nitrophenyl group, a tolyl group, a carboxyphenyl group and a sulfoxyphenyl group.

In the general formula (V), $R_4$, $R_5$ and $R_6$ independently stand for an alkyl group having 1 to 9 carbon atoms, and any one of $R_4$, $R_5$ and $R_6$ may be a hydrogen atom.

In the general formula (VI), $R_7$ is selected from an alkyl group having 2 to 9 carbon atoms, a phenyl group, a benzyl group, a benzoyl group and a propionyl group.

In the photosensitive saponified polyvinyl acetate derivative of the present invention, it is preferred that the saponified polyvinyl acetate should have a saponification degree of 50 to 100% and a polymerization degree of 300 to 4000. It is also preferred that 0.1 to 50 mole %, especially 0.5 to 30 mole %, of vinyl alcohol units contained in the vinyl structural units of the saponified polyvinyl acetate be substituted by the photosensitive unit and 0.1 to 30 mole %, especially 0.4 to 20 mole %, of vinyl alcohol units contained in the vinyl structural units of the saponified polyvinyl acetate be substituted by the hydrophobic unit.

If the amount of the photosensitive unit is smaller than 0.1 mole %, the photosensitivity is often insufficient, and if the amount of the photosensitive unit exceeds 50 mole %, no particular improvement of the photosensitivity is attained but an increase of the viscosity is conspicuous and it sometimes happens that the composition cannot be used. If the amount of the hydrophobic unit is smaller than 0.1 mole %, the water resistance of the obtained cured resin is insufficient, and if the amount of the hydrophobic unit exceeds 30 mole %, the water development of the obtained photosensitive resin composition becomes difficult and the resolving power is insufficient.

Where saponified polyvinyl acetate is in the form of an aqueous solution, when the vinyl alcohol group of the saponified polyvinyl acetate is substituted by the hydrophobic unit, if more than 2 mole % of the vinyl alcohol units contained in the vinyl structural units of the saponified polyvinyl acetate are substituted by the hydrophobic unit, the hydrophobic property of the resulting hydrophobic saponified polyvinyl acetate derivative is too strong and the hydrophobic saponified polyvinyl acetate derivative cannot be stably dissolved but is precipitated. In order to keep the system in the form of a stable solution, it is necessary to incorporate an appropriate amount of an organic solvent having a compatibility with water, such as an alcohol.

In contrast, to our great surprise, it was found that where saponified polyvinyl acetate is present as a protecting colloid for a resin emulsion, even if more than 2 mole % of vinyl alcohol units of the backbone of the saponified polyvinyl acetate are substituted by the hydrophobic group, and hence the hydrophobic characteristic is enhanced, the resin emulsion containing this protecting colloid which has been rendered hydrophobic can be stored stably for a long time only with water as the solvent. The cause of this surprising phenomenon has not been completely elucidated. However, it is considered that the cause will probably be as follows. An emulsion resin formed by polymerization using saponified polyvinyl acetate as the protecting colloid is stably dispersed in water by the hydrating power of the saponified polyvinyl acetate, and the saponified polyvinyl acetate used as the protecting colloid is substantially grafted to the vinyl acetate polymer in the emulsion resin. Accordingly, even if a hydrophobic group is introduced into some OH groups of the saponified polyvinyl acetate, the resin emulsion is stably dispersed by the hydrating power of the remaining OH groups.

Namely, in the present invention, the resin emulsion can be stabilized for a long time by the hydrating and dispersing power of the photosensitive saponified polyvinyl acetate, rendered hydrophobic, which forms the protective colloid for the emulsion resin. In contrast, where the saponified polyvinyl acetate derivative is dissolved in water, with enhancement of the hydrophobic characteristic, the water solubility is reduced and precipitation is finally caused.

The photosensitive composition of the present invention comprising the photosensitive saponified polyvinyl acetate derivative as the protecting colloid is effectively prepared by condensing (1) saponified polyvinyl acetate in the presence of an aqueous emulsion of a film-forming hydrophobic resin with (2) at least one photosensitive unit-introducing agent selected from quaternary ammonium salt compounds (styrylpyridinium salt compounds and styrylquinolinium salt compounds) represented by the following general formulae (VII) and (VIII):

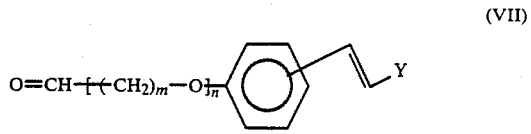

and

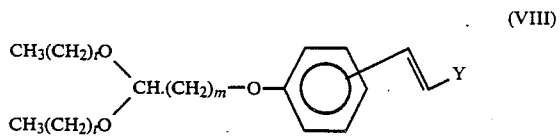

wherein

Y, m and n are as defined above, and t is 0 or 1, and (3) at least one hydrophobic unit-introducing selected from aldehyde compounds such as butyl aldehyde, octyl aldehyde, heptyl aldehyde, nonyl aldehyde, benzaldehyde, naphthyl aldehyde, aminobenzaldehyde, nitrobenzaldehyde, carboxybenzaldehyde and sulfoxybenzaldehyde in the presence of an acid catalyst.

According to another process for the preparation of the photosensitive resin composition of the present invention, saponified polyvinyl acetate is first acylated by an acylating agent, an aqueous emulsion of a film-forming resin is prepared by using the acylated saponified polyvinyl acetate as the protective colloid, and condensing the acylated saponified polyvinyl acetate derivative, in the presence of the aqueous emulsion of a film-forming resin, with at least one member selected from quaternary ammonium salt compounds represented by the above-mentioned general formulae (VII) and (VIII). As the acylating agent used in this process, there can be mentioned chlorides such s acetyl chloride, cinnamoyl chloride propionyl chloride and benzoyl chloride, and acid anhydrides such as acetic anhydride and benzoic anhydride.

As the quaternary ammonium salt compounds represented by the general formulae (VII) and (VIII), there can be mentioned styrylpyridinium salt compounds such as 1-methyl-4-[2-(4-2,2-dimethoxyethoxyphenyl)ethenyl]pyridinium methosulfate, N-methyl-4-(p-formylstyryl)pyridinium methosulfate and N-methyl-2-(p-formylstyryl)pyridinium hydrochloride, and styrylquinolinium salt compounds such as 1-methyl-4-[2-(4-2,2-dimethoxyethoxyphenyl)ethenyl]-quinolinium methosulfate, N-methyl-4-(p-formylstyryl)-quinolinium methosulfate and N-methyl-2-(p-formylstyryl)-quinolinium hydrochloride.

In each of the foregoing processes, the condensation reaction of the saponified polyvinyl acetate or acylated saponified polyvinyl acetate, in the presence of the resin emulsion, with the above-mentioned quaternary ammonium salt compound and the above-mentioned aldehyde compound is accomplished by heating them in the aqueous emulsion at an appropriate temperature, for example, 30° to 90° C., at a pH value of 1 to 3.5 in the presence of an acid catalyst for an appropriate time, for example, 1 to 20 hours, and stirring the reaction mixture or allowing it to stand at normal temperature for a whole day and night.

As the film-forming resin used in the present invention, there can be mentioned a vinyl acetate polymer, a vinyl acetate/ethylene copolymer, a vinyl acetate/acrylic acid copolymer, a vinyl acetate/acrylic acid ester copolymer, an acrylic acid ester polymer, an acrylic acid/acrylic acid ester copolymer, a styrene polymer, a styrene/acrylic acid copolymer, a styrene/acrylic acid ester copolymer, a vinyl chloride polymer, a vinylidene chloride polymer, a vinyl acetate/methacrylic acid copolymer, a vinyl acetate/methacrylic acid ester copolymer, a styrene/butadiene copolymer, an acrylonitrile/butadiene copolymer and a vinyl acetate/Veova (supplied by Shell Chemical) copolymer, each of which contains saponified polyvinyl acetate as the protecting colloid.

Note, Veova mentioned above is a compound represented by the following structural formula:

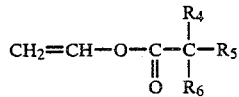

wherein $R_4$, $R_5$ and $R_6$ are as defined above.

These resins are stabilized in emulsions by the photosensitive saponified polyvinyl acetate as the protecting colloid.

In the photosensitive composition of the present invention, the photosensitive saponified polyvinyl acetate derivative, which is present as the protective colloid for the film-forming resin emulsion, enhances the water resistance, solvent resistance and resolving power of an image portion formed by light exposure and curing, by dint of the photosensitive unit of the general formula (I) and the hydrophobic unit of the general formula (IV), (V) or (VI), bonded to the main chain of the saponified polyvinyl acetate, while retaining the water-developing property of the composition. Furthermore, the composition can be stably stored for a long time even though water alone is used as the medium.

In the photosensitive resin composition of the present invention, since the main component is an emulsion resin comprising a relatively large amount of a photosensitive saponified polyvinyl acetate derivative as the protective colloid, the solvent resistance of the obtained image is very excellent. Furthermore, although the photosensitive saponified polyvinyl acetate derivative has a main chain formed of saponified polyvinyl acetate, since a hydrophobic unit is introduced into the main chain, an image having an excellent water resistance can be formed.

Generally, if a hydrophobic group is introduced into the OH group of saponified polyvinyl acetate, the water solubility of the obtained hydrophobic saponified polyvinyl acetate derivative is reduced, and the polyvinyl acetate derivative cannot be stably dissolved unless a mixed solvent comprising water and an organic solvent is used as the medium. In contrast, according to the present invention, since the photosensitive saponified polyvinyl acetate derivative is present as a protective colloid for the emulsion resin and the majority of the saponified polyvinyl acetate derivative is grafted to the emulsion resin, even if a considerable portion of the OH group is blocked with the hydrophobic group, by the dispersing force (not the dissolving force) of the remaining OH group, the saponified polyvinyl acetate derivative can be kept stable in water for a long time.

Accordingly, even if water alone is used as the medium, the photosensitive resin composition of the present invention has an excellent water resistance, solvent resistance, and storage stability and can give an image having an excellent resolving power and smoothness. Moreover, the photosensitive composition of the present invention shows an excellent adhesion to a substrate.

The present invention will be further illustrated with reference to the following illustrative but not limitative examples.

EXAMPLE 1

In 1 kg of an aqueous emulsion of polyvinyl acetate (polyvinyl acetate/saponified polyvinyl acetate=60/40, saponification degree of saponified polyvinyl acetate=88%, polymerization degree of saponified polyvinyl acetate=1800, solid content of the emulsion=30%) were dissolved 12 g of N-methyl-4-(p-formylstyryl)pyridinium methosulfate and 10 g of n-butyl aldehyde. The pH value was adjusted to 2.5 by phosphoric acid, and the mixture was stirred at 60° C. for 4 hours and further stirred at normal temperature a whole day and night. After completion of the condensation reaction, the pH value of the reaction liquid was adjusted to 6 to 7 by aqueous ammonia to form a photosensitive composition. The composition was coated in a film thickness of 15 μm on a screen printing plate (250-mesh nylon) and then dried.

A negative film was placed on the obtained photosensitive plate, and the photosensitive plate was irradiated with light emitted from a 2-KW ultra-high pressure mercury lamp located 1 m above the plate for 3 minutes. The exposed photosensitive plate was developed with water. The exposed area was left while the nonexposed area was washed away, whereby an image was formed.

With respect to the photosensitive plate and the obtained printing plate, the water resistance, resolving power and solvent resistance of the light-exposed portion, the number of the residual steps at the test using Step Tablet No. 2 of Eastman Kodak Co. and the smoothness of the image portion were determined.

The obtained results are shown in Table 1.

EXAMPLE 2

In 1 kg of an aqueous emulsion of a vinyl acetate/vinyl propionate copolymer (vinyl acetate/vinyl propionate=90/10) comprising a saponified vinyl 2,2-dibutylhexylate/vinyl acetate copolymer (polymerization degree=1800, saponification degree=80 mole %, vinyl 2,2-dibutylhexylate content=6 mole %) as the protecting colloid (vinyl acetate/vinyl propionate copolymer:saponified vinyl 2,2-dibutylhexylate/vinyl acetate copolymer=80:20, solid content of the emulsion=30%) was dissolved 6 g of N-methyl-4-(p-formylstyryl)pyridinium methosulfate, and the pH value was adjusted to 2.5 by dilute sulfuric acid. By using this solution, a component (A) of the photosensitive resin composition was prepared in the same manner as described in Example 1.

Separately, 100 g of saponified polyvinyl acetate (polymerization degree=2000, saponification degree=98%) and 15 g of N-methyl-4-(p-formylstyryl)pyridinium methosulfate were dissolved in 900 g of water, and the pH value was adjusted to 2.5 by dilute sulfuric acid. A component (B) of the photosensitive resin composition was prepared by using this solution in the same manner as described in Example 1.

Then, 100 g of the component (A) was mixed with 100 g of the component (B) to form a photosensitive resin composition, and the properties were determined in the same manner as described in Example 1.

The obtained results are shown in Table 1.

EXAMPLE 3

In 2 l of pyridine was suspended 100 g of saponified polyvinyl acetate (polymerization degree=1800, saponification degree=88 mole %), and 10 g of benzoic anhydride was added to the suspension and the mixture was stirred at 40° to 60° C. for 10 hours and then at room temperature for 20 hours. The solid was recovered, washed with methanol and dried to form an acylated resin (A). By using this resin (A) as the protective colloid, an aqueous emulsion of polyvinyl acetate (polyvinyl acetate/resin (A)=60/40, solid content of the emulsion=30%) was formed by polymerization according to customary procedures. Then, 10 g of N-methyl-4-(p-formylstyryl)-quinolinium methosulfate was added to 1 kg of the polyvinyl acetate emulsion, and the pH value was adjusted to 2.5 by phosphoric acid. In the same manner as described in Example 1, a photosensitive resin composition was prepared and the properties were determined.

The obtained results are shown in Table 1.

COMPARATIVE EXAMPLE 1

In 1 kg of an aqueous polyvinyl acetate emulsion (polyvinyl acetate/saponified polyvinyl acetate=60/40, saponification degree of saponified polyvinyl acetate=88%, polymerization degree of saponified polyvinyl acetate=1800, solid content of the emulsion=30%) was dissolved 12 g of N-methyl-4-(p-formylstyryl)-pyridinium methosulfate, and the pH value was adjusted to 2.5 by phosphoric acid. In the same manner as described in Example 1, a photosensitive resin composition was prepared and the properties were determined.

The obtained results are shown in Table 1.

COMPARATIVE EXAMPLE 2

In 1 kg of an aqueous emulsion of a vinyl acetate/vinyl propionate copolymer (vinyl acetate/vinyl propionate=90/10) (vinyl acetate/vinyl propionate copolymer:saponified polyvinyl acetate=96:4, saponification degree of saponified polyvinyl acetate=80%, polymerization degree of saponified polyvinyl acetate=1800, solid content of the emulsion=30%) was dissolved 1.2 g of N-methyl-4-(p-formylstyryl)-pyridinium methosulfate, and the pH value was adjusted to 2.5 by dilute sulfuric acid. By using this solution, a component (C) of the photosensitive resin composition was prepared in the same manner as described in Example 1. Separately, 100 g of saponified polyvinyl acetate (polymerization degree=2000, saponification degree=88%) and 15 g of N-methyl-4-(p-formylstyryl)-pyridinium methosulfate were dissolved in 900 g of water and the pH value was adjusted to 2.5 by dilute sulfuric acid. By suing this solution, a component (D) of the photosensitive resin composition was prepared in the same manner as described in Example 1.

Then, 100 g of the component (C) was mixed with 180 g of the component (D) to form a photosensitive resin composition. The properties were determined in the same manner as described in Example 1.

The obtained results are shown in Table 1.

COMPARATIVE EXAMPLE 3

To 1 kg of an aqueous polyvinyl acetate emulsion (polyvinyl acetate/saponified polyvinyl acetate=60/40, saponification degree of saponified polyvinyl acetate=88%, polymerization degree of saponified polyvinyl acetate =1800, solid content of the emulsion =30%) was added 10 g of N-methyl-4-(p-formylstyryl)-quinolinium methosulfate, and the pH value was adjusted to 2.5 by phosphoric acid. By using this emulsion, a photosensitive resin composition was prepared in the same manner as described in Example 1 and the properties were determined.

The obtained results are shown in Table 1.

COMPARATIVE EXAMPLE 4

In a mixed solvent comprising 700 g of water and 200 g of ethyl alcohol were dissolved 100 g of saponified polyvinyl acetate (saponification degree=88%, polymerization degree=1800), 10 g of N-methyl-4-(p-formylstyryl)-pyridinium methosulfate and 8 g of n-butyl aldehyde, and the pH value was adjusted to 2.5 by phosphoric acid. By using this solution, a component (E) of the photosensitive resin composition was prepared in the same manner as described in Example 1. Then, 100 g of the component (E) was mixed with 33 g of an aqueous polyvinyl acetate emulsion (polyvinyl acetate/saponified polyvinyl acetate=96/4, solid content of the emulsion=50%) to form a photosensitive resin composition. The properties were determined in the same manner as described in Example 1.

The obtained results are shown in Table 1.

COMPARATIVE EXAMPLE 5

In 1 kg of the same polyvinyl acetate emulsion as used in Comparative Example 4 was dissolved 2 g of N-methyl-4-(p-formylstyryl)-pyridinium methosulfate, and the pH value was adjusted to 2.5 by phosphoric acid and a component (F) of the photosensitive resin composition was prepared in the same manner as described in Example 1. Then, 100 g of the component (E) synthesized in Comparative Example 4 was mixed with 33 g of the component (F) to form a photosensitive resin composition. The properties were determined in the same manner as described in Example 1.

The obtained results are shown in Table 1.

COMPARATIVE EXAMPLE 6

In 100 g of water were dissolved 100 g of saponified polyvinyl acetate (saponification degree=88%, polymerization degree=1800), 10 g of N-methyl-4-(p-formylstyryl)-pyridinium methosulfate and 8 g of n-butyl aldehyde, and the pH value was adjusted to 2.5 and a component (G) of the photosensitive resin composition was prepared in the same manner as described in Example 1.

Then, 100 g of the component (G) was mixed with 33 g of the same polyvinyl acetate emulsion as used in Comparative Example 4 to form a photosensitive resin composition. The properties were determined in the same manner as described in Example 1.

The obtained results are shown in Table 1.

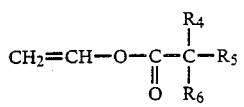

wherein
each of $R_4$, $R_5$ and $R_6$ is independently selected from the groups consisting of hydrogen and an alkyl group having 1 to 9 carbon atoms; and a protective colloid for said emulsion, wherein the solid weight ratio of the protective colloid to the film-forming vinyl polymer resin is in the range of from 5/95 to 99/1, and the protective colloid consists essentially of at least one photosensitive saponified polyvinyl acetate derivative, said photosensitive saponified polyvinyl acetate derivative consisting essentially of a backbone of saponified polyvinyl acetate and at least one photosensitive unit and at least one hydrophobic unit bonded to said backbone, wherein 0.1 to 50 mole % of the vinyl alcohol units in the vinyl strucutural units of the saponified polyvinyl acetate are substituted with said photosensitive unit, and 0.1 to 30 mole % of the vinyl alcohol

TABLE 1

| | Medium in Photosensitive Resin Composition Emulsion | Storage Period of Photosensitive Resin Composition Emulsion | Water Content (based on weight of photosensitive resin solid) | Methylethyl Ketone Content (based on weight of photosensitive resin solid) | Resolving Power | Number of Residual Steps by Step Tablet No. 2 by Eastman Kodak Co. | Smoothness of Image Portion | Hydrophobic Resin Protective Colloid Ratio* |
|---|---|---|---|---|---|---|---|---|
| Example 1 | water | more than 1 year | 40% | 50% | 40μ | 7 | good | 60/40 |
| Example 2 | water | more than 1 year | 70% | 40% | 50μ | 7 | good | 60/40 |
| Example 3 | water | more than 1 year | 40% | 50% | 40μ | 8 | good | 60/40 |
| Comparative Example 1 | water | more than 1 year | 120% | 60% | 100μ | 4 | bad | 60/40 |
| Comparative Example 2 | water | more than 1 year | 140% | 120% | 100μ | 4 | bad | 60/40 |
| Comparative Example 3 | water | more than 1 year | 110% | 60% | 100μ | 5 | bad | 60/40 |
| Comparative Example 4 | water + ethanol | more than 1 year | 60% | 130% | 40μ | 7 | good | 60/40 |
| Comparative Example 5 | water + ethanol | more than 1 year | 50% | 120% | 40μ | 7 | good | 60/40 |
| Comparative Example 6 | water | 1 week | 60% | 130% | 40μ | 7 | good | 60/40 |

Note *The solid weight ratio of the film-forming hydrophobic resin to the protective colloid.

We claim:

1. A photosensitive aqueous resin emulsion composition consisting essentially of an aqueous emulsion of a film-forming vinyl polymer resin selected from the group consisting of vinyl acetate polymers, vinyl acetate/ethylene copolymers, vinyl acetate/acrylic acid copolymers, vinyl acetate/acrylic acid ester copolymers, acrylic acid ester polymers, acrylic acid/acrylic acid ester copolymers styrene polymers, styrene/acrylic acid copolymers, styrene/acrylic acid ester copolymers, vinyl chloride polymers, vinylidene chloride polymers, vinyl acetate/methacrylic acid copolymers, vinyl acetate/methacrylic acid ester copolymers, styrene/butadiene copolymers, acrylonitrile/butadiene copolymers and copolymers of vinyl acetate with a compound of the formula units in the vinyl strucutural units of the saponified polyvinyl acetate are substituted with said hydrophobic unit, said photosensitive unit being selected from the groups represented by the following general formula (I):

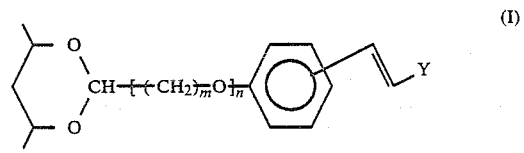

wherein

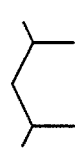

stands for a vinyl alcohol unit residue of the saponified polyvinyl acetate in the backbone, Y stand for a group represented by the following formula (II) or (III):

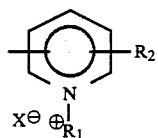 (II)

or

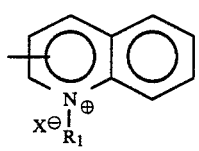 (III)

m is an integer of from 1 to 6, n is 0 or 1, and in the formulae (II) and (III), $R_1$ stands for a hydrogen atoms, an unsubstituted alkyl group, an unsubstituted aralkyl group or an alkyl or aralkyl group having at least one member selected from a hydroxyl group, a carbamoyl group, an ether bond and an unsaturated bond, $R_2$ stands for a member selected from a hydrogen atom and lower alkyl groups and $X^-$ stands for an anion, and said hydrophobic unit being selected from the groups represented by the following formulae (IV), (V) and (VI):

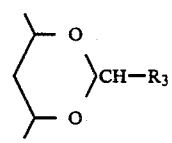 (IV)

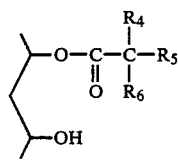 (V)

and

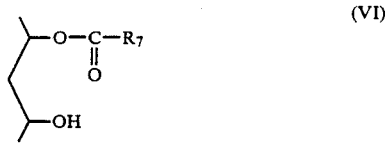 (VI)

wherein

is as defined above, $R_3$ stands for a member selected from a hydrogen atom, an alkyl group having 1 to 18 carbon atoms, a phenyl group, a naphthyl group, an anthryl group, an aminophenyl group, a nitrophenyl group, a halogenophenyl group, a styryl group, a benzyl group, an allyl group, a xylyl group, a tolyl group, a carboxyphenyl group and a sulfoxyphenyl group, $R_4$, $R_5$ and $R_6$ are as defined above and $R_7$ stands for a member selected from an alkyl group having 2 to 9 carbon atoms, a phenyl group, a benzyl group, a halogenophenyl group, an allyl group, a naphthyl group, a styryl group, a xylyl group, an anthryl group, a tolyl group, a benzoyl group and a propionyl group, wherein said composition is obtained by condensing said saponified polyvinyl acetate or an acylated derivative of said saponified polyvinyl acetate with a compound which is a source for said hydrophobic unit and a compound which is a source for said photosensitive unit, said condensation being in the presence of said aqueous emulsion of film-forming vinyl polymer resin, whereby said photosensitive saponified polyvinyl acetate derivative is at least partially grafted onto said film-forming vinyl polymer resin.

2. A composition as set forth in claim 1, wherein said solid weight ratio is in the range of from 15/85 to 95/5.

3. A composition as set forth in claim 1, wherein the saponification degree of the saponified polyvinyl acetate is 50 to 100%.

4. A composition as set forth in claim 3, wherein the polymerization degree of the saponified polyvinyl acetate is 300 to 4,000.

5. A composition as set forth in claim 1, wherein 0.5 to 30 mole % of the vinyl alcohol units are substituted by said photosensitive unit.

6. A composition as set forth in claim 1, wherein 0.4 to 20 mole % of the vinyl alcohol units are substituted by said hydrophobic unit.

* * * * *